United States Patent [19]
Chang

[11] Patent Number: 5,452,511
[45] Date of Patent: Sep. 26, 1995

[54] COMPOSITE LEAD FRAME MANUFACTURING METHOD

[76] Inventor: Alexander H. C. Chang, 6048 Crossview Cir., San Jose, Calif. 95120

[21] Appl. No.: 147,838
[22] Filed: Nov. 4, 1993
[51] Int. Cl.$^6$ .................................................. H01R 43/00
[52] U.S. Cl. ............................................. 29/827; 437/220
[58] Field of Search ............................. 29/827; 437/206, 437/220; 174/50.6

[56] References Cited

U.S. PATENT DOCUMENTS

| | | | |
|---|---|---|---|
| 3,832,480 | 8/1974 | Bunker | 174/525 |
| 4,180,161 | 12/1979 | Henrickson et al. | 206/328 |
| 4,214,364 | 7/1980 | St. Louis et al. | 29/827 |
| 4,461,924 | 1/1982 | Butt | 174/52 FP |
| 4,514,750 | 4/1985 | Adams | 357/70 |
| 4,568,796 | 2/1986 | Lebailly | 174/52 R |
| 4,820,658 | 4/1989 | Gilder, Jr. et al. | 29/827 |
| 4,857,988 | 8/1989 | Fottler | 357/74 |
| 4,872,260 | 10/1989 | Johnson et al. | 29/827 |
| 4,908,337 | 3/1990 | Treffer | 29/827 |
| 4,994,936 | 2/1991 | Hernandez | 361/306 |
| 5,014,418 | 5/1991 | Wright | 29/827 |
| 5,339,518 | 8/1994 | Tran et al. | 29/827 |

FOREIGN PATENT DOCUMENTS

| | | | |
|---|---|---|---|
| 53-25360 | 3/1978 | Japan . | |
| 60-223147 | 7/1985 | Japan . | |
| 61-212031 | 9/1986 | Japan | 437/220 |
| 63-221635 | 9/1988 | Japan | 437/220 |
| 2178894 | 2/1987 | United Kingdom | H01L/23/148 |

*Primary Examiner*—P. W. Echols
*Attorney, Agent, or Firm*—Michael J. Hughes

[57] ABSTRACT

A method for constructing a composite lead frame (10) wherein a plurality of lead segments (14) are separately constructed and then attached to a frame member (12). A plurality of the frame members (12) may optionally be produced as a lead frame strip (16). Each of the frame members (12) has an opposed pair of side rails (18) and a pair of cross members (20) for enclosing a lead area (22) wherein the lead segments (14) are affixed to the side rails (18) and the cross members (20) by a plurality of assembly tabs (40).

20 Claims, 3 Drawing Sheets

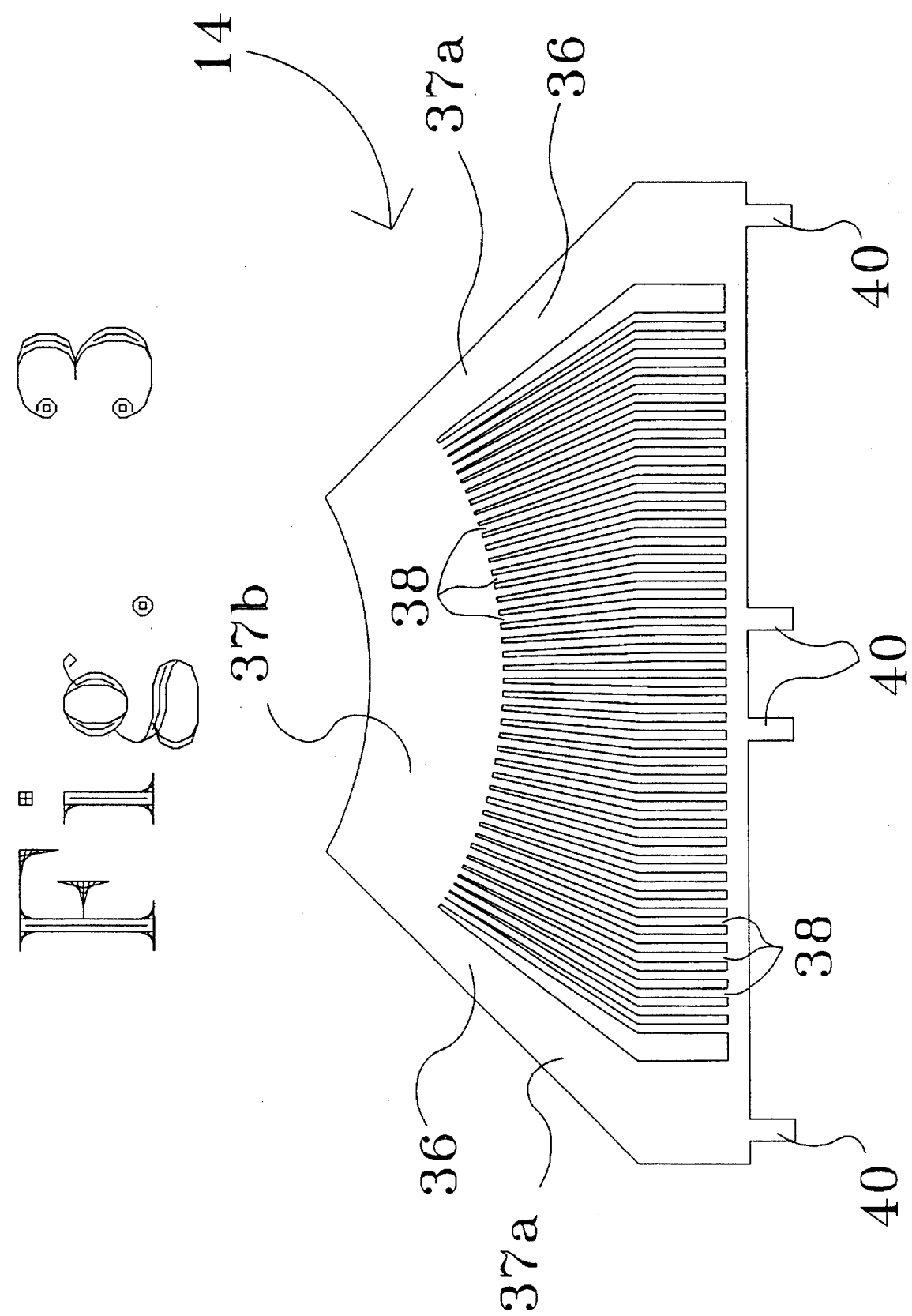

COMPOSITE LEAD FRAME MANUFACTURING METHOD

TECHNICAL FIELD

The present invention relates generally to the packaging of semiconductor devices which are subsequently mounted on printed circuit boards, and more particularly to improvements relating to the efficiency of manufacture of high lead density components. The predominant current usage of the inventive composite lead frame, and associated fabrication process therefor, of the present invention is as a means to provide high lead count lead frames at a lower cost and/or with more leads than has been attainable using prior art methods.

BACKGROUND ART

There exists today a need to provide semiconductor packages which have a very great number of leads but which are also of a very small overall size. One component of a semiconductor package is a "lead frame", which is a conductive metal part having a plurality of leads for connecting to the semiconductor chip, such that the leads will extend from the package for connection to a circuit board when the semiconductor device is eventually incorporated into an electronic device. The lead frame will also have one or more joining strips for combining the leads into a unitary structure during the semiconductor manufacturing process. After the leads are affixed to the semiconductor chip, the joining strips are removed from the leads. U.S. Pat. No. 5,281,849 discloses an invention, of which the present inventor was a coinventor, relating to a semiconductor package having a segmented lead frame. A U.S. Pat. No. 5,263,242 discloses and claims another aspect of the segmented lead frame technology. The above two referenced applications have addressed improvements in the field involving the substitution of a conventional lead frame, in certain applications, with a plurality of lead frame segments. However, such substitution is only a feasible alternative where it is economically practical to provide for the differences in semiconductor chip manufacturing methods attendant upon the introduction of those new inventions into the overall manufacturing process. Furthermore, the teachings of those referenced applications do not address the problem of the increased degree of precision alignment between leads which is required, particularly in plastic packages, when lead densities will be increased beyond those currently available on the market. Despite the many advances in the field made by the present inventor and others, the rapid advances in large scale integrated circuit technology are continually demanding that packaging and lead frame construction methods be improved to accommodate the ever more complex integrated circuits for which they are constructed.

One of the most significant problems facing the industry today involves the need to provide an ever increasing number of leads in a package of a generally fixed size. Presently, lead frames having 208 leads are commonly produced, but lead frames having more than 208 leads are very expensive. Using known technology, it has proven to be very difficult indeed to produce lead frames having more than 208 leads, and impossible to do so with acceptable reliability and economy.

The two primary methods for producing lead frames are either to stamp the lead frames from a metal ribbon or to use a chemical etching process to etch the lead frames. For large quantities, the chemical etching process is by far the more expensive alternative (given that the marginal cost for lead frames produced by the chemical etching process is much greater, while the fixed cost for tooling dies for the stamping process is quite large). Therefore, until recently the chemical etching method was considered to be a viable alternative only when small quantities of a particular lead frame configuration were required. Now, however, in spite of the much greater marginal costs, etched lead frames are being used exclusively for lead frames having a lead count greater than 208 leads because the stamping of such lead frames has proven to be prohibitively expensive using presently available technology. Presently available high density lead frame stamping methods require a die costing as much as, or even more than, seven hundred thousand dollars. Furthermore, such dies provide very little flexibility with, generally, only three die pad configuration options available at an additional cost of about $80,000 each. Also, as previously mentioned, the life of a 208 lead die is only about eight million units, as compared to an expected one hundred fifty million unit life for a conventional 24 lead tool.

To the inventor's knowledge, no economical and practical method for reliably producing lead frames having a lead count greater than 208 leads is known in the prior art. All lead frame construction methods for such very high lead count lead frames have required the extremely costly process of etching the entire lead frame.

DISCLOSURE OF INVENTION

Accordingly, it is an object of the present invention to provide a semiconductor lead frame manufacturing method which can economically and reliably produce lead frames having lead counts greater than 208 leads.

It is another object of the present invention to provide a semiconductor lead frame manufacturing method which can produce lead frames which can be substituted for etched or stamped lead frames, such that existing manufacturing equipment will not have to be altered.

It is yet another object of the present invention to provide a semiconductor lead frame manufacturing method which can economically provide numerous minor variations of a basic lead frame design.

It is still another object of the present invention to provide a semiconductor lead frame manufacturing method which is an economical method for producing either large or small quantities of lead frames.

It is yet another object of the present invention to provide a semiconductor lead frame manufacturing method which is an economical method for producing lead frames having either high or relatively lower lead counts when smaller quantities and/or several variations of the lead frame are required.

It is still another object of the present invention to provide a semiconductor lead frame manufacturing method which can be used with inexpensive plastic packages wherein there is no inherent alignment of the leads built into the package and lead alignment is entirely dependent upon a properly manufactured lead frame.

It is yet another object of the present invention to provide a semiconductor lead frame manufacturing method which will produce lead frames having a lead count greater than that available using prior art methods.

Briefly, the preferred embodiment of the present invention is a method for producing a lead frame wherein the lead frame is constructed by joining a plurality of disparate components. Two or more lead frame segments are separately manufactured and then affixed to a lead frame strip, the lead frame strip being a connected series of segment joining frames. The lead frame strip may be constructed from metal or other material and is stamped from a web or material strip using inexpensive stamping techniques. The lead frame segments may be either stamped or etched from conventional lead frame material, as is most appropriate to the quantity required. Stamped and etched lead segments may be combined in the same composite lead frame. Where required, the lead segments, or the ends thereof, can be plated or otherwise treated prior to attachment to the lead frame strip. Since many lead frames are symmetrical, or at least roughly so, two or more of the lead frame segments may be alike to each other. Variations of the lead frame may be produced by substituting one or more alternative lead segments.

An advantage of the present invention is that higher lead count densities are attainable than could be produced in the prior art.

A further advantage of the present invention is that lead frames produced by the inventive method may be used with conventional integrated circuit assembly techniques and equipment.

Yet another advantage of the present invention is that lead frames produced by the inventive method may be used with inexpensive plastic chip packaging.

Still another advantage of the present invention is that tooling cost for producing lead frames can be greatly reduced.

Yet another advantage of the present invention is that an unlimited number of variations of a basic lead frame design may be produced at minimal additional expense.

Still another advantage of the present invention is that the cost of manufacture of lead frames is reduced.

These and other objects and advantages of the present invention will become clear to those skilled in the art in view of the description of the best presently known mode of carrying out the invention and the industrial applicability of the preferred embodiment as described herein and as illustrated in the several figures of the drawing.

BRIEF DESCRIPTION OF THE DRAWING

FIG. 3 is a top plan view of one of the lead segments of FIG. 1.

BEST MODE FOR CARRYING OUT INVENTION

The best presently known mode for carrying out the invention is a method for constructing a composite lead frame for use in the packaging of integrated circuit semiconductor devices. The predominant expected usage of the inventive composite lead frame manufacturing method is in the manufacture of lead frames for use in the packaging of semiconductor chips requiring very high lead density.

Figure 1:
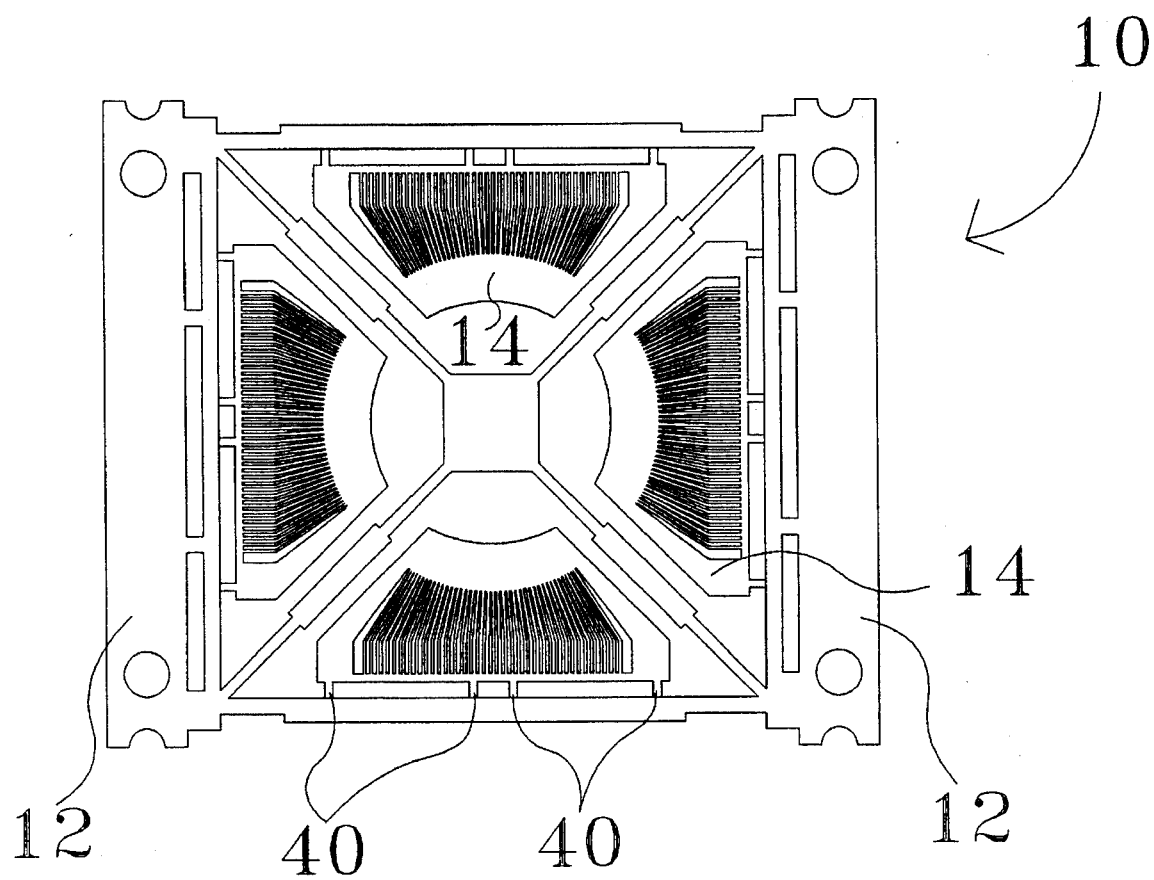
FIG. 1 is a top plan view of a composite lead frame constructed according to the present inventive method.

A composite lead frame according to the present inventive composite lead frame manufacturing method is illustrated in a top plan view in FIG. 1 and is designated therein by the general reference character 10. In the view of FIG. 1, the inventive composite lead frame 10 does not look greatly unlike conventional stamped or etched lead frames (not shown). However, there are several significant differences, as will be discussed in more detail hereinafter.

As can be seen in the view of FIG. 1, the composite lead frame has a frame member 12 and a plurality (four, in the example of FIG. 1) of lead segments 14. It should be noted that, in the example of FIG. 1, all of the lead segments 14 are identical although, as will be discussed in more detail hereinafter, in many applications it will be desirable to substitute one or more non-identical lead segments (not shown) for one or more of the lead segments 14 depicted in FIG. 1. It should further be noted that the invention is not restricted to applications wherein the quantity of the lead segments 14 is four, as will also be discussed in further detail hereinafter.

Figure 2:
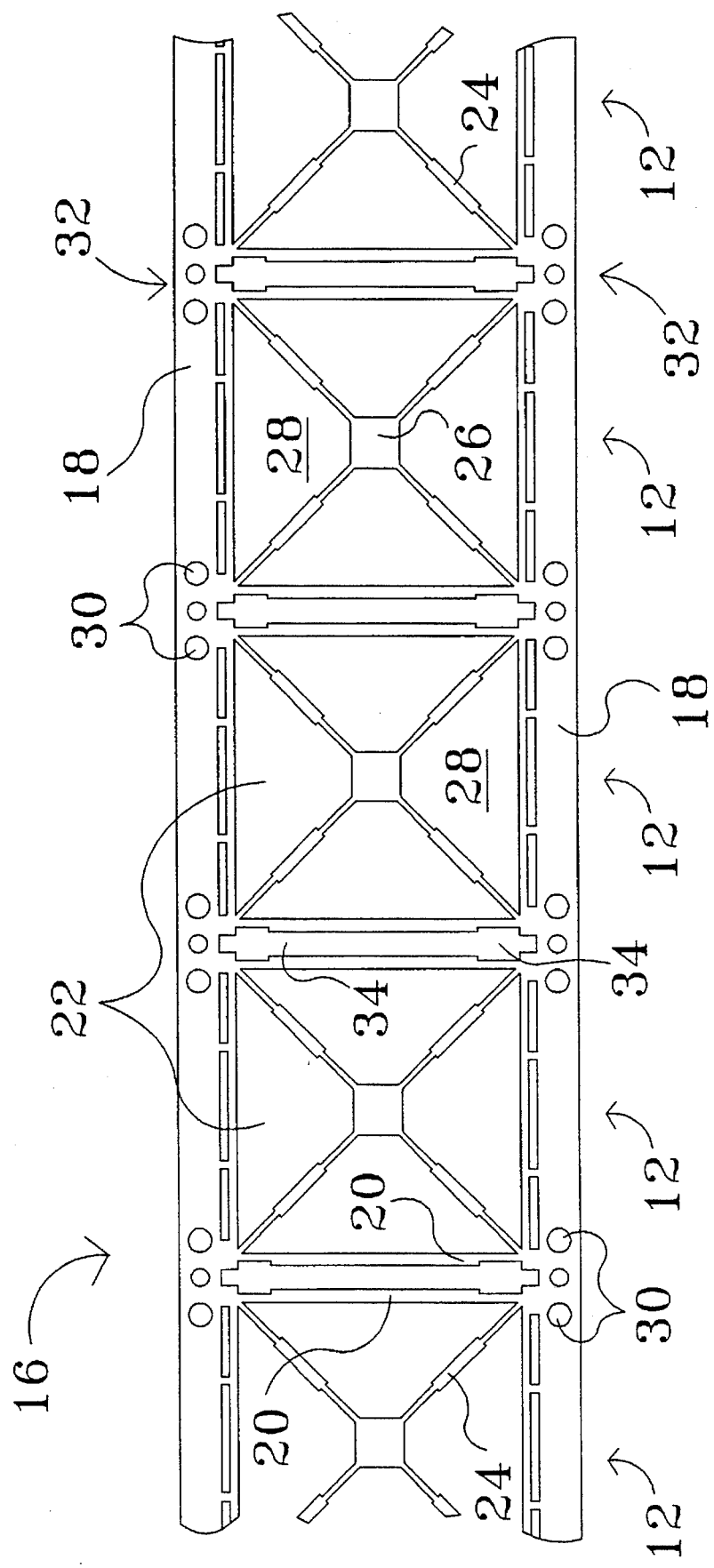
FIG. 2 is a top plan view of a lead frame strip according to the present invention.

FIG. 2 is a top plan view of a lead frame strip 16 according to the present invention. The lead frame strip 16 is a connected series of the frame members 12. In the best presently known embodiment 10 of the present invention, an indeterminate quantity of the frame members 12 may be included in the lead frame strip 16, dependent upon the length of the material from which the lead frame strip 16 is produced. Alternatively, the lead frame strip 16 could have a fixed determinate quantity of frame members 12 (such as four or six) to accommodate semiconductor device manufacturing apparatus designed to accept lead frame strips 16 of such sizes. Also, although the inventor does not presently anticipate a need for such a variation, the lead frames 12 could be produced individually such that the quantity of lead frames 12 in a lead frame strip 16 would be one.

In the best presently known embodiment 10 of the present invention, the lead frame strip 16 is stamped from a material not unlike that from which conventional lead frames (not shown) are constructed. However, it is anticipated that the present inventive method might also allow the use of very inexpensive materials such as less expensive metals or even synthetic materials. In the best presently known embodiment 10 of the present invention, the lead frame strip 16 is stamped in much the same manner as are conventional lead frames (not shown), although the die will be very inexpensive indeed as compared to that needed to produce a detailed lead frame, and should last much longer than those used for conventional lead frames. As can be seen in the view of FIG. 2, the lead frame strip 16 has a pair of opposed side rails 18 running the length of the lead frame strip 16. Each of the frame members 12 is enclosed by a pair of cross members 20 to enclose a generally square lead area 22 within each of the frame members 12. An "X" shaped rigidity member 24 is provided within each of the frame members 12 and is connected to the frame member 12 at each intersection of a side rail 18 and a cross member 20. In the best presently known embodiment 10 of the present invention, the rigidity member 24 has at the center thereof a generally square rigidity center portion 26. It can readily be appreciated that the size and shape of the rigidity center portion 26 can be adjusted to conform to the space available in the application so as to maximize the overall rigidity of the composite lead frame. It is anticipated that, at least in some applications, the rigidity center portion 26 may also act as a ground or voltage plane or as a die attach plane in the assembled semiconductor package with, in some instances, at least a portion of the rigidity member 24 acting as an electrical lead thereto. As can be seen in the view of FIG. 2, the rigidity member 24 divides the lead area 22 into a plurality (four, in the best presently known embodiment 10 of the present invention) of lead segment areas 28.

The lead frame strip 16 has a plurality (four per frame member 12 in the best presently known embodiment 10 of the present invention) of alignment holes 30 for positioning the lead frame strip 16 during attachment of the lead segments 14 and further for positioning the composite lead frames 10 during their application to the semiconductor package for which they are intended. Each of the frame members 12, except those that are on an end of the lead frame strip 16 (not shown) is connected on the lead frame strip 16 to its adjoining frame member(s) 12 by a plurality (one per side rail 18 per adjoining frame member 12) of cutting areas 32. As can be seen in the view of FIG. 2, the frame members 12 are further separated by separation cut-outs 34 such that when the cutting areas 32 on the side rails 18 are cut through, each of the frame members 12 is left intact (see FIG. 1).

FIG. 3 is a top plan view of one of the lead segments 14 of FIG. 1. The lead segment has a segment subframe 36 surrounding a plurality (forty one, in the example of FIG. 3) of individual leads 38. A plurality (four, in the example of FIG. 3) of assembly tabs 40 protrude from the exterior of the segment subframe 36. As can be seen in the view of FIGS. 1 and 3, the lead segments 14 are formed to fit within the lead segment areas 28 (FIG. 2).

Although the example of FIG. 3 depicts the lead segment 14 as having only forty one individual leads 38, the inventive method is equally applicable and, indeed, primarily intended for applications wherein an even greater lead density is required. The quantity of forty one leads 38 in the lead segment 14 of FIG. 3 is illustrative only. Nevertheless, in applications wherein a number of variations on a lead frame design is required, or where the production of stamping dies would otherwise be impractical, the inventive method might well be the most economical alternative even where the total quantity of leads on the composite lead frame 10 would be fewer than 208. It should also be noted that, although the best presently known embodiment 10 of the present invention has the leads 38 entirely enclosed within the segment subframe 36 a pair of frame side portions 37a of the segment subframe might be retained in the final assembly of a semiconductor package to be used as leads 38. Furthermore, a frame interior portion 37b might, in some instance, be omitted from the construction of the lead segments 14.

In the best presently known embodiment 10 of the present invention, the lead segments 14 are constructed by stamping the lead segment 14 from conventional lead frame material. The cost of producing a die for stamping the inventive lead segments 14 is many times less than that for a die required to stamp a comparable unitary lead frame, this cost generally being a non-linear function of the complexity of such a die. As previously mentioned herein, it is within the scope of the invention that the lead segments 14 might be constructed by other means, such as by etching, depending in part upon the quantity of each such part required in the application. Indeed, where an application might call for a large quantity of the composite lead frames 10 having variations in only one of the lead segments 14, it might be most practical to etch that particular lead segment 14 while stamping the remainder of the lead segments 14.

Having produced the lead segments 14 by the method appropriate to the application, as discussed above, the lead segments 14, or portions thereof, can then be plated or otherwise treated according to the requirements of the application. As is discussed in more detail in the U.S. Pat. No. 5,281,849, referenced above, where it is desired that only the ends of the leads 38 be so treated, construction of a unitary lead frame requires that a very costly special material strip, with only portions thereof plated, be used. However, the present inventive method has in common with the U.S. Pat. Nos. 5,281,849 and 5,263,242 the additional advantage that the lead segments 14 can easily and inexpensively be individually processed according to the needs of the application. For example, where it is required that only the ends of the leads 38 be plated the lead segments 14 can be processed using a cladding process which is more economical than plating and which only affects the necessary portion of the leads 38.

Referring again to FIG. 1, having constructed the lead segments 14 individually and the frame members 12 either individually or as a lead frame strip 16 (FIG. 2), the composite lead frame 10 is assembled by joining the assembly tabs 40 to the frame member 12 as depicted in FIG. 1. In the best presently known embodiment 10 of the present invention, the assembly tabs 40 are joined to the frame member 12 by welding, although soldering or even gluing might be appropriate to some application and material combinations.

Various modifications may be made to the invention without altering its value or scope. For example, while the composite lead frame 10 described herein has four of the lead segments 14, one skilled in the art will recognize that other applications may require another quantity, such as eight, of the lead segments 14, with appropriate corresponding modifications to the frame member 12.

Another conceivable change would be to provide lead segments which are, themselves, asymmetrical, even though the composite lead frame might be either fully or partially symmetrical.

All of the above are only some of the examples of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

INDUSTRIAL APPLICABILITY

The composite lead frames 10 manufactured according to the present inventive method are intended for use in the packaging of semiconductor integrated circuits, particularly those requiring a very high lead density. The predominant current usage is for application to inexpensive plastic packages wherein there are no inherent features in the package, such as alignment grooves, which might serve to exactly align the leads 38 and hold them in place during assembly of the package.

It should be noted that the best presently known embodiment 10 of the present invention, as described herein, is not unlike in finished appearance to a conventional unitarily constructed lead frame. However, this aspect of the best presently known embodiment 10 should not be considered to be a restriction on the scope of the invention, since the sole purpose in so utilizing the present inventive method to construct the best presently known embodiment 10 in a form so alike to conventional lead frames as to enable the composite lead frames 10 so constructed to be used with presently available semiconductor packaging machines and methods. A semiconductor manufacturer using the composite lead frames 10 of the best presently known embodiment 10 of the present invention will be able to utilize the composite lead frames 10 essentially without regard to the fact that these have been constructed using the present inventive method. It is anticipated by the inventor that, as the present inventive method is further developed, and as the economy of using the present inventive method becomes apparent to semiconductor manufacturers, the necessity of causing the composite lead frames 10 to be so alike in their finished form to prior art unitary lead frames will lapse.

As briefly discussed previously herein, if the economy achieved by the present inventive method were such that each of the lead segments 14 in a composite lead frame 10 having four of the lead segments 14 were to cost approximately one quarter the amount to produce as would a comparable unitary lead frame then, in such a hypothetical case, there would not be an appreciable cost savings in the present inventive method. Even in such a hypothetical situation, the advantages of the additional variability provided by the present inventive method might still make its application worthwhile. However, it should be noted that, due to the considerable marginal increases in the cost of producing stamping dies as the complexity of these increases, it is anticipated that the cost of dies required for use with the present inventive method will be significantly less than one quarter of the cost of dies required for prior art methods. Also, it should be remembered that it is anticipated that the present inventive method will permit the production of even higher lead densities than are attainable using prior art methods at any expense. Moreover, since the present inventive method allows for the use of relatively inexpensive materials for the frame members 12, and since the costs of plating or otherwise treating the lead segments 14 will be considerably less than the costs of comparable processes in the prior art, it is further anticipated that even greater cost savings will be had as these aspects of the invention are further developed.

Since the composite lead frames 10 constructed according to the present inventive method may be utilized in any application wherein conventional unitarily constructed lead frames are used, and since they will provide improved economy and variability, it is expected that they will be acceptable in the industry as substitutes for the conventionally constructed lead frames. For these and other reasons, it is expected that the utility and industrial applicability of the invention will be both significant in scope and long-lasting in duration.

I claim:

1. A method for constructing a lead frame for use in the packaging of semiconductor devices, the lead frame comprising:

constructing a frame member including an opposing pair of side rails and further including an opposing pair of cross members such that the side rails and the cross members enclose a generally rectangular lead area;

constructing a plurality of lead segments, the lead segments including a plurality of leads at least substantially framed by a segment subframe; and affixing said lead segments to said frame member to form the lead frame, wherein;

the segment subframes include a plurality of assembly tabs extending therefrom for attaching said lead segments to said frame member.

2. The method of claim 1, wherein:

said frame member further includes a rigidity member affixed between the side rails and intersecting the lead area.

3. The method of claim 2, wherein:

the rigidity member is generally "X" shaped and affixed to said frame member at each intersection of the side rails and the cross members.

4. The method of claim 3, wherein:

the rigidity member includes an enlarged center portion.

5. The method of claim 4, wherein:

the enlarged center portion of the rigidity member is used as a voltage plane in the assembly of the semiconductor package.

6. The method of claim 1, wherein:

said side rails include a plurality of alignment holes therein.

7. The method of claim 1, wherein:

said frame members are constructed by stamping said frame members from a strip of stock material.

8. The method of claim 1, wherein:

said frame members are constructed in an interconnected series thereof.

9. The method of claim 8, wherein:

said interconnected series is in the form of a strip with cutting areas separating said frame members, the cutting areas located so as to separate said frame members from each other when the side rails are cut through at the cutting areas.

10. The method of claim 1, wherein:

said lead segments are attached to said frame members by welding.

11. A method for constructing a lead frame, comprising:

constructing a lead frame strip having at least one frame member with a generally rectangular lead area therein;

separately constructing a plurality of lead segments, each of said lead segments having a plurality of leads, a segment subframe connecting all of the leads in that lead segment together such that each of said lead segments is a unitary body; and joining said plurality of lead segments to the frame member, within the lead area thereof, to form the lead frame, wherein;

the segment subframe has protruding outwardly therefrom at least one joining tab; and the joining of said plurality of lead segments to the frame member is accomplished by connecting the joining tab to the frame member.

12. The method of claim 11, wherein:

the quantity of said lead segments attached to the frame member is four.

13. The method of claim 11, wherein:

said lead frame strip is constructed by stamping.

14. The method of claim 11, wherein:

said lead frame strip includes more than one of the lead frame members.

15. A method for constructing a lead frame for use in the packaging of semiconductor devices, the lead frame comprising:

constructing a frame member including an opposing pair of side rails and further including an opposing pair of cross members such that the side rails and the cross members enclose a generally rectangular lead area;

constructing a plurality of lead segments, the lead segments including a plurality of leads at least substantially framed by a segment subframe; and affixing said lead segments to said frame member to form the lead frame, wherein;

the lead frame includes a plurality of assembly tabs for attaching said lead segments to said frame member.

16. The method of claim 15, wherein:

said frame member further includes a rigidity member affixed between the side rails and intersecting the lead area.

17. The method of claim 16, wherein:

the rigidity member is generally "X" shaped and affixed to said frame member at each intersection of the side rails and the cross members.

18. The method of claim 17, wherein:

the rigidity member includes an enlarged center portion.

19. The method of claim 18, wherein:

the enlarged center portion of the rigidity member is used as a voltage plane in the assembly of the semiconductor package.

20. The method of claim 15, wherein:

said side rails include a plurality of alignment holes therein.

\* \* \* \* \*